PROCESS FOR MAKING THIN FILM CIRCUIT DEVICES

Filed Nov. 16, 1964 3 Sheets-Sheet 1

INVENTORS
Joe T. Pierce
John P. Pritchard, Jr.
BY E. Mickey Hubbard
Attorney

PROCESS FOR MAKING THIN FILM CIRCUIT DEVICES

Filed Nov. 16, 1964 3 Sheets-Sheet 3

United States Patent Office 3,402,073
Patented Sept. 17, 1968

3,402,073
PROCESS FOR MAKING THIN FILM CIRCUIT DEVICES

Joe T. Pierce and John P. Pritchard, Jr., Richardson, Tex., assignors to Texas Instruments Incorporated, Dallas, Tex., a corporation of Delaware Continuation-in-part of application Ser. No. 387,299, Aug. 4, 1964. This application Nov. 16, 1964, Ser. No. 415,845
11 Claims. (Cl. 117—212)

ABSTRACT OF THE DISCLOSURE

Disclosed is a method for simultaneously cleaning the surface of a metal exposed through windows in a layer of photoresist material and polymerizing the photoresist material to produce a very stable insulating film by the bombardment of both the surface of the metal and the material with ionized particles in a glow discharge. Also disclosed are a method of fabricating parallel plate capacitors using photoresist material irradiated in a glow discharge as the dielectric, and a method of forming insulating films by doping the photoresist material with additional material having desired properties and then irradiating the photoresist material in a glow discharge.

This is a continuation-in-part of application S.N. 387,299 entitled, "Process for Making Highly-Conductive Junctions Between Sequentially Deposited Metal Films," filed Aug. 4, 1964, and now abandoned.

The present invention relates to a process for fabricating multilayer, thin film cryogenic circuits and the like, and more particularly relates to a process for cleaning metal surfaces and producing a superconductive junction between two successively deposited metallic films, and to a process for producing an improved insulating layer which may be directly patterned.

In general, cryogenic circuits may be considered as those circuits which are operated at such low temperatures that metal becomes superconductive and exhibits no resistance until the current exceeds a critical limit for the particular temperature, at which time the metal abruptly reverts to normal resistivity. Different metals have different critical current levels for a specific temperature and for a particular magnetic field strength in which the metal is positioned. A cryotron utilizes this phenomenon to provide a means for switching a particular carrier conductor from superconductivity to normal resistivity. A cryotron is formed by positioning a metal control conductor having a relatively high critical current in close proximity to a metal gate conductor having a relatively low critical current. A current in the control conductor below the critical level will nevertheless create a magnetic field adjacent the carrier conductor sufficient to switch the carrier conductor from superconductivity to normal resistivity so that a free-cycling current, for example, in the carrier conductor can be abruptly stopped.

In copending application S.N. 399,018, entitled "Process for Manufacturing Multilayer Film Circuits," filed Jan. 20, 1964, and assigned to the assignee of the present invention, a process for manufacturing thin film circuits in general, and cryogenic circuits in particular, was described. In that process, cryotrons are fabricated by first forming conductor strips of one type of metal such as tin on a substrate, covering the substrate and strips with a layer of insulating material having windows over portions of the tin strips, and then depositing a second metal film over the insulating material so that it passes through the windows and makes contact with the previously deposited metal strips. Thus by alternate layers of conductive strips and insulation, the circuit is built up with electrical contact between successive layers made through windows in the insulating film.

The critical current level in a superconductive strip is materially affected by the purity of the metal. A nonsuperconductive impurity in a small cross section of the conductor will result in a zone of reduced critical current. Therefore, unless the junction between the successively deposited metal films is very clean and free from contaminants, the conductor formed by the two films may not be superconductive, or may have such a low critical current level as to make the circuit inoperative. The process described above presents a particular problem in this regard because after each metallic film is deposited, the substrate must be removed from the vacuum chamber so that the film may be selectively removed by photoresist and etching techniques to form the various conductors. Another layer of photoresist is then formed over the conductors, exposed and developed to form windows to expose predetermined portions of the previously deposited conductors. The exposed surfaces of the metal upon which the next metallic film is to be deposited through the windows formed in the insulating layer are therefore contaminated both by the residues of the developing fluids and the photoresist, and also by the oxides of the metal film, all of which are nonsuperconductive.

One of the most important materials used in fabricating thin film circuits is the insulator between successive conductive layers. To produce complex systems with high component density, an insulating film free of defects must be deposited over areas as large as ten square inches. The most common defects are pinholes and cracks caused by substrate contamination and tensile stresses present during deposition. The tensile stresses present in vapor-deposited films are strongly influenced by parameters such as source temperature and residual gases present in the vacuum chamber. Stressed films of silicon oxide often crack and peel from the substrate resulting in aborting circuits in which much time has been invested. Also, the dielectric properties of some insulators, especially the metal oxides, undergo large changes with temperature and aging, adding to problems of circuit design.

We have discovered that the surface of a preceding, patterned metallic film can be thoroughly cleaned so as to produce a superconductive junction between the preceding metallic film and a sequentially deposited metallic film to produce a jointed superconductor, and that the photoresist layer can be simultaneously polymerized to produce an improved insulating layer by irradiating the structure with charged particles prior to the deposition of the next metallic layer.

More specifically, the substrate bearing the first metallic film and the layer of photoresist is placed in a vacuum chamber which is then evacuated to as low a pressure as the equipment will permit in order to purge all undesirable gases from the chamber. The chamber is then backfilled with a controlled atmosphere, preferably argon or hydrogen, to a pressure less than about $10^{-2}$ millimeters of mercury. A voltage is impressed across a pair of electrodes positioned in the vacuum chamber adjacent the substrate such that the atoms of the gas are ionized and accelerated by the electric field to bombard or irradiate the surface of the substrate, including the layer of photoresist and the portion of the underlying metallic film exposed through the windows in the photoresist An A.C. voltage of from about 5,000 volts to about 15,000 volts is preferably used, with about 10,000 volts usually being optimum. After the surface of the substrate is irradiated, the chamber may again be evacuated without breaking the seal and the second film deposited by evaporation.

Although the simultaneous cleaning of the preceding metallic layer and the fixing of the photoresist is an important advantage in the fabrication of cryogenic and other thin film circuits, it is to be understood that the production of an improved insulating film which can be directly patterned is of considerable importance in the fabrication of thin film integrated circuits and thin film devices in general. Although the precise formula of the organic polymer insulating film resulting from irradiating the conventional photoresist with charged particles cannot be readily determined by the invention, the resulting properties indicate that the photoresists are polymerized to produce long chain stable organic compounds. Another aspect of the invention concerns a process for patterning the insulating film.

Therefore an important object of the present invention is to provide a process for producing improved multilayer, thin film circuits. Another object of the invention is to provide such a process which requires fewer steps.

Another object of the invention is to provide a process for producing a superconductor from two or more sequentially deposited metal films.

A further object of the invention is to provide a process for producing a highly superconductive junction between two sequentially deposited metal films.

Still another object of this invention is to provide a process for thoroughly cleaning the surface of a metallic film or the like.

Another object of the invention is to provide a process for producing an improved organic, thin insulating film.

Yet another object of the invention is to provide such an insulating film which may be directly patterned by selective removal of predetermined portions thereof, either before or after the insulating film is fixed by irradiation.

Additional objects and advantages of this invention will be evident to those skilled in the art from the following detailed description and drawings, wherein.

Figure 1:
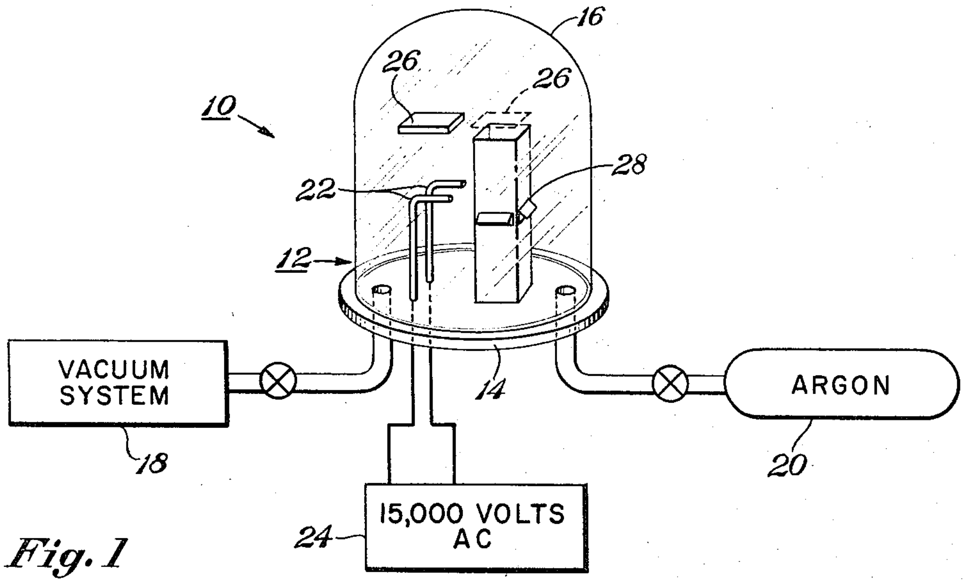
FIGURE 1 is a schematic drawing of a system which may be used to carry out the process of the present invention.

Referring now to the drawings, and in particular to FIGURE 1, a system for carrying out the process of the present invention is indicated generally by the reference numeral 10. The system 10 is comprised of a vacuum chamber 12 which may have a suitable base 14 to which a bell jar 16 is sealed. A suitable vacuum system 18 is provided to evacuate the chamber 12. The vacuum system 18 may be of any suitable type, but should be capable of producing vacuums as low as $10^{-7}$ millimeters of mercury and should have adequate traps and filter means for maintaining the atmosphere within the chamber 12 as pure and controlled as possible. A source 20 of argon, hydrogen, or other suitable gas as will be hereafter described in greater detail, is provided for filling the chamber 12 to the desired pressure with a controlled atmosphere. A pair of electrodes 22 are connected to a variable voltage A.C. source 24 which should be capable of supplying as high as 15,000 volts A.C. across the electrodes 22. A suitable mechanism (not illustrated) is provided for supporting a substrate 26 in position #1 as illustrated in solid outline so that the substrate may be irradiated by ionized particles as hereafter described. The support means includes suitable means for moving the substrate to position #2, illustrated in dotted outline, without breaking the vacuum in the chamber 12. A suitable vacuum evaporation and condensation system for coating the substrate when in position #2 with a thin metallic film includes a chimney 28 which contains a vessel of the metal to be deposited on the substrate and means for heating and vaporizing the metal. The evaporated metal will propagate upwardly through the chimney and nucleate on the lower surface of the substrate to form a film. The chimney 28 prevents excessive deposits on the interior surface of the bell jar 16 and other equipment within the vacuum chamber.

Figure 2:
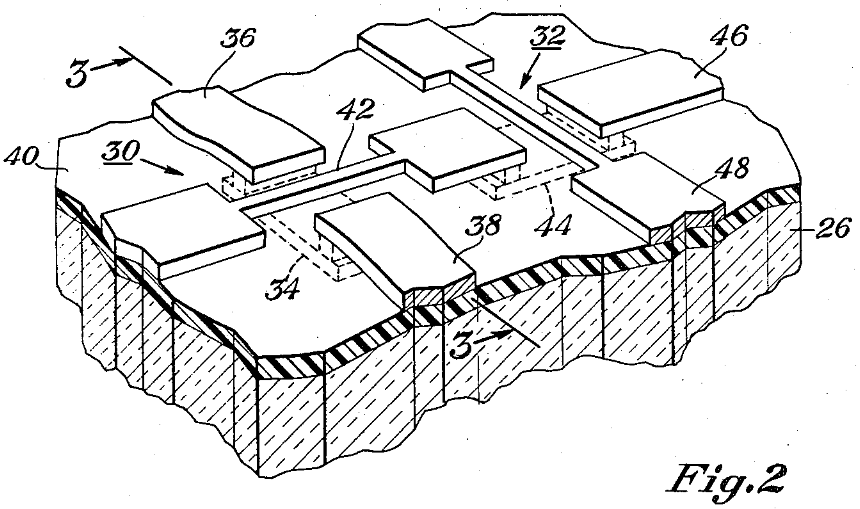
FIGURE 2 is an enlarged perspective view, somewhat schematic, of a thin film cryogenic circuit which may be fabricated using the process of the present invention.

A portion of a typical cryogenic circuit device which may be fabricated using the process of the present invention is illustrated in FIGURE 2. The substrate 26 upon which the circuit is formed may conveniently comprise a sheet of glass approximately two inches square. The circuits is comprised of two cryotrons indicated generally by the reference numerals 30 and 32. The cryotron 30 has a carrier conductor which is comprised of a tin gate strip 34 and lead strips 36 and 38. As further shown in FIGURE 3, the strips 36 and 38 pass through windows 50 and 52 in a polymer insulating film 40 and contact the tin gate strip 34. A lead control strip 42 passes over the gate strip 34 and is insulated from the tin gate strip by the insulating film 40. Referring again to FIGURE 2, the cryotron 32 is of the same construction as cryotron 30 and has a carrier conductor comprised of a tin gate strip 44, the lead strip 42, and another lead strip 46, and a control conductor 48 which passes over the tin gate strip 44 and is electrically insulated from the gate strip by the insulating film 40.

Figure 3:
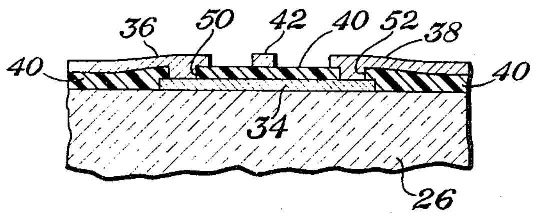
FIGURE 3 is a sectional view taken substantially on lines 3—3 of FIGURE 2.

The process of the present invention can best be understood by reference to the circuit device of FIGURE 2, although it is to be understood that the invention is not limited to the particular circuit illustrated. In constructing the circuit, a thin film of tin is deposited over the entire substrate 26 by a vacuum evaporation process in the system 10. The substrate 26 is then removed from the vacuum system and the tin film coated with a photoresistant which is exposed in preselected areas and developed to remove all areas of the photoresist except where the tin film is to remain to form the tin gate strips 34 and 44. The unprotected tin is removed by an etchant, and the photoresist film is preferably stripped from the substrate by a suitable stripping solution. Then the insulating film 40 is formed over the entire substrate by applying an additional coat of photoresist which is dried under an infrared lamp. The windows are then formed in the photoresist through which contact can be made with the remaining tin strips. For example, the coat of photoresist material may be exposed and developed so as to remove portions over the tin strips 34 and 44 and form the windows 50 and 52 as illustrated in FIGURE 3. At this point it will be noted that the surfaces of the portions of the tin gate strip exposed through the windows in the insulation film 40 have been exposed to the atmosphere and have been in intimate contact with the photoresist material and the developing fluids, all of which tend to contaminate the surface of the metal by residues and oxides. This much of the process for constructing the circuit device is described and claimed in the above referenced copending application.

In accordance with the invention, the substrate is irradiated or bombarded with ionized particles to simultaneously clean the exposed surface of the tin strips and polymerize the photo-resist material to produce an improved insulating layer. The substrate is placed at position #1 in the vacuum chamber 12 with the film of photoresist and the exposed surface of the tin film facing downwardly. The chamber is evacuated as much as practical with the available equipment, preferably to about $10^{-5}$ or $10^{-6}$ millimeters of mercury, in order to purge the chamber of any undesirable gases. Then the chamber is backfilled to a pressure in the range from about $10^{-3}$ to about $10^{-2}$ millimeters of mercury with a gas which is to supply the charged particles. The preferred gas is argon, but hydrogen or steam may be used to provide a reducing atmosphere, or other inert gases may be used if desired. An A.C. voltage from power supply 24 is then applied to the spaced electrodes 22 and the magnitude of the voltage adjusted until the dark portion of the glow created by the voltage envelopes the substrate 26. The dark portion of the glow is selected because it represents the zone of highest energy particles. About 9,000 A.C. volts is optimum in one system similar to that illustrated in FIGURE 1. It is believed that any voltage between about 5,000 and 15,000 will produce desirable results, but the exact voltage is dependent upon the position of the electrodes 22 relative to the substrate 26 and the pressure within the chamber 12. As a result of the voltage, the atoms within the chamber are ionized, the ionized particles are accelerated by the electromagnetic field created by the voltage applied to the electrodes and the particles impinge on the substrate surface including the windowed photoresist and the metallic film exposed by the windows.

The ionized particles impinging on the downwardly-facing surfaces of the metal film exposed by the windows thoroughly clean the oxides, chemical residues and other contaminants from the surface of the metal. The exact process by which the metal surface is cleaned is not known. However, it is believed that the oxides of the metal are removed both mechanically by the impact of the particles and by a chemical reaction resulting from a change in the ionic charge of the oxide which permits a chemical reduction or sublimation of the oxide material. A similar process is believed to remove the residues and other foreign matter which might have contaminated the surface of the metal by exposure to the atmosphere, the photoresist materials, the developing fluids and the etchants. The surface of the metals may be cleaned by this process as long as desired, but fifteen minutes is usually adequate, the time period required being merely a matter of optimization with a particular process system.

In accordance with a very important aspect of this invention, the ionized particles impinging on the layer 40 of photoresist material also polymerize the photoresist to produce a very stable insulating film. The photoresist materials are light-sensitive organic polymers and are in wide use throughout the industry for patterning metal films and oxide insulation layers to construct microcircuits. There are at least two types of light-sensitive polymers which have been successively polymerized by the present invention. One type is patented to the Azoplate Corporation of Murray Hill, New Jersey, and described in various aspects in U.S. Patents 2,958,599, 2,975,053, 2,989,455, 2,994,608, 2,994,609, 2,995,442. Another type is patented to the Eastman Kodak Company of Rochester, New York, and described in its various aspects in U.S. Patents 2,690,966, 2,732,301, 2,861,057.

The precise chemical reaction produced by irradiation or bombardment of the photoresist material is not known. However, it is believed that the energy from the charged particles causes the basic polymer material of the photoresist to realign and form into very long chain structures which are unusually stable to chemicals, physical abrasion and temperature cycling. All commercially available forms of photoresist which have been tried in this process have been successful. Accordingly, it is believed that at least all photosensitive polymers can be fixed in this manner to produce a more stable film having good dielectric properties as will hereafter be described in greater detail. As used in this specification and the appended claims, the term "photosensitive polymer" shall mean the polymers of the general class described by the above patent and those commercially available and widely used photoresist materials. The photo-resist materials have particular utility in the fabrication of thin film circuits because they can readily be patterned by photographic techniques and resist most metal etchants. Accordingly, an important aspect of this invention is the polymerization or 'fixing" of the patternable photoresist materials. However, in accordance with the broader aspects of the invention, it is believed that most polymers can be polymerized by irradiation with charged particles, and in particular by irradiation with ions of argon, helium and the other inert gases.

The photoresist materials produced and marketed by the Azoplate Corporation under the trade names AZ-17 and AZ-1350 are the so-called positive resist type wherein the area exposed to ultra-violet light is subsequently removed by the conventional developing solutions. Each of these photoresists has been successfully fixed by this process. In general, exposure of the positive type photoresist to the ultra-violet light changes the photoresist material from a higher order polymer to a lower order polymer which can be removed by developing solutions which do not affect the unexposed areas. Prior to the irradiation by the charged particles, the unexposed portion of the positive resist can also be easily stripped from the substrate by acetone. However, after the photoresist has been polymerized by the bombardment of charged particles, the resulting high order polymer film is fixed against subsequent exposure and development, and against stripping agents, as well as against all etchants customarily used to pattern the metal films. Thus the positive photoresist solution, such as AZ-17, can be patterned by exposing the portion to be removed to ultra-violet light and then developing the exposed portion away. Then the patterned resist can be inspected under the microscope and if faulty can be removed by stripping with acetone or by exposing and developing the resist remaining since it has not previously been exposed. If the pattern of the photoresist is acceptable, it can then be fixed by irradiation with the charged particles as described above. Subsequently deposited metal films and photoresist layers can be patterned with impunity without danger of damaging previously fixed insulating layers with the developing, stripping and etching solutions.

In accordance with another important aspect of the invention, the positive photoresists can be patterned after irradiation by protecting predetermined areas of the photoresist from irradiation with patterned metal films. The unprotected portion of the photoresist will then be fixed by polymerization, while the portion shielded by the metal film can be removed by an acetone stripper. Or, if desired, the unprotected portion of the positive photoresist may be photographically patterned by exposure to ultra-violet light, the exposed portion removed by development, and the remaining portion then fixed by irradiation with the charged particles.

A group of so-called negative photoresist solutions are marketed by the Eastman Kodak Company under the trade names KPR, KMER, and KPFR. These negative resist solutions are selectively removed in the areas which are not exposed to ultra-violet light, i.e., are intially subject to removal by the developing fluids, but are polymerized to a sufficient degree by exposure to ultra-violet light as to resist the developing solutions. These solutions have also been successfully used in the present invention.

After the cleaning and fixing step is completed, the chamber 12 is immediately evacuated to as low a pressure as the vacuum system will conveniently pull, preferably about $10^{-5}$ or $10^{-6}$ millimeters of mercury. The lower the pressure obtainable within the chamber 12 the better. The substrate 26 is moved to position #2 (illustrated in dotted outline) over the chimney 28, and the source of metal disposed within the chimney 28 heated so as to evaporate the metal to be deposited. The atoms of metal propagate upwardly and impinge on the lower surface of the substrate 26 whereupon the metal atoms nucleate and form a metal film over the entire substrate. The metal atoms also pass through the windows in the insulating film 40 and collect on the exposed and cleaned surfaces of the tin gate strips 34 and 44. This deposition process provides a very pure metal film. The previously deposited metal film is also very pure if deposited by the same process, so that after the surface has been cleaned as described above, a continuous superconductor is formed from two different metals, and the junction between the two will have essentially the same critical current levels as the minimum critical current level of the two metals for a corresponding cross section. The substrate may then be removed from the vacuum chamber and portions of the second deposited film selectively removed by photoresist techniques to produce the conductors 36, 38, 42, 46 and 48. The process may be repeated as many times as desired in order to build substantially any circuit.

As described in the above-referenced application, the lead conductors such as 36, 38, 42, 46 and 48 may be deposited first, the windowed insulating film 40 formed, and then the tin strips deposited. Of course, the process of the present invention may also be used to clean the lead film which is first deposited.

In one example of the process described above, the critical current of a fifty square mil tin-to-lead contact was increased from fifty milliamps to six hundred milliamps by bombarding the lead contact as described prior to the deposition of the tin film.

The directly patternable insulating films formed by bombardment of photoresist with the charged particles, more specifically argon ions from a glow discharge, have been cycled from 3° K. to 500° K. without structural defects resulting in the films. The fact that no structural defects occur from temperature cycling indicates that the films are relatively stress free and resistant to damage due to mismatched coefficients of expansion of the substrate and other layers of material. Further, the films exhibit relatively high resistance to contact pressure and abrasions. As previously mentioned, the insulating films are chemically stable in a wide variety of acids and bases, and in particular are stable in acetone, nitric acid etch solutions, and the conventional photoresist developing solutions. This permits the insulating layer to be used in many adverse environments, and in particular permits the subsequent process steps necessary to construct thin film circuits to be carried out without protecting the fixed insulating layer.

The dielectric properties of an insulating film formed by irradiation with argon ions has been measured by fabricating parallel plate capacitors using the insulating film as the dielectric. The capacitors were fabricated by spinning the liquid photoresist solution onto a thin metallic film deposited on a substrate to form one of the capacitor plates. The thickness of the resulting film is a function of the rotational velocity of the substrate and the viscosity of the photoresist applied to the spinning substrate. Thicker films may also be formed by merely gravity-flowing the photoresist liquid over the surface of the substrate, and thinner films may be formed by creating a fog or cloud of the photoresist and permitting the photoresist to condense on the surface of the substrate. Immediately after the liquid photoresist is applied to the substrate in the desired thickness, the substrate is exposed to infrared radiation to drive out the solvents. The solvents are thus driven from the photoresist polymer at a relatively slow rate so as to prevent rupture of the film as the solvents escape, as is often caused by baking the substrate. Air circulaion in the vicinity of the substrate is desirable, and the circulated air should be very clean to prevent contamination of the film. The photoresist film is then subjected to irradiation by argon ions using the glow discharge process heretofore described. This fixes the photoresist film by driving the film to a higher order polymer. Then a second metallic film is formed over the insulating layer and subsequently patterned by photoresist and etch techniques to form the second parallel capacitor plate. A yield of 90 percent was obtained using this technique of fabrication. Sets of capacitors utilizing AZ–17 and KPR as the insulator film were fabricated using this technique.

Figure 4:
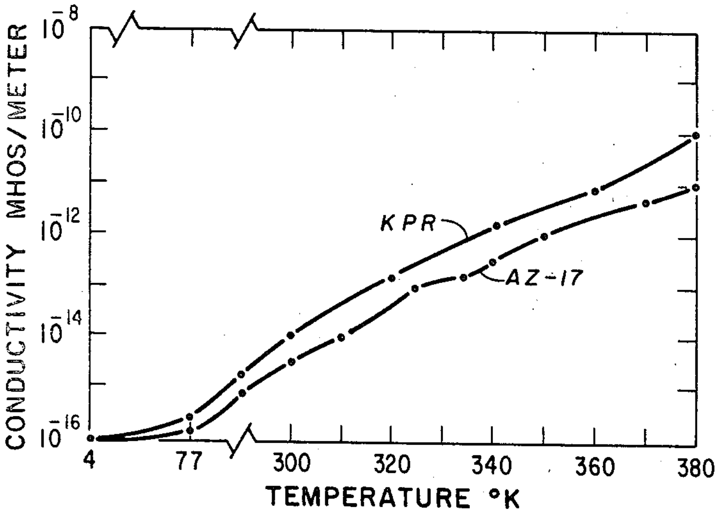
FIGURE 4–9 are graphs illustrating the electrical properties of the insulating film formed by the process of the present invention.
Figure 5:
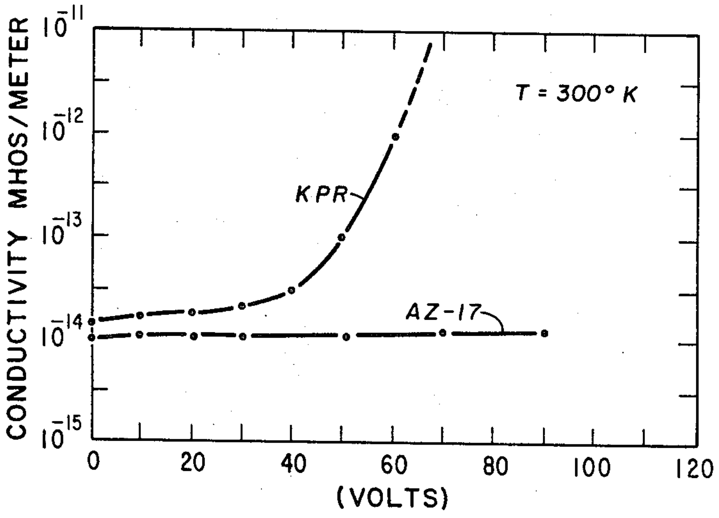
Figure 6:
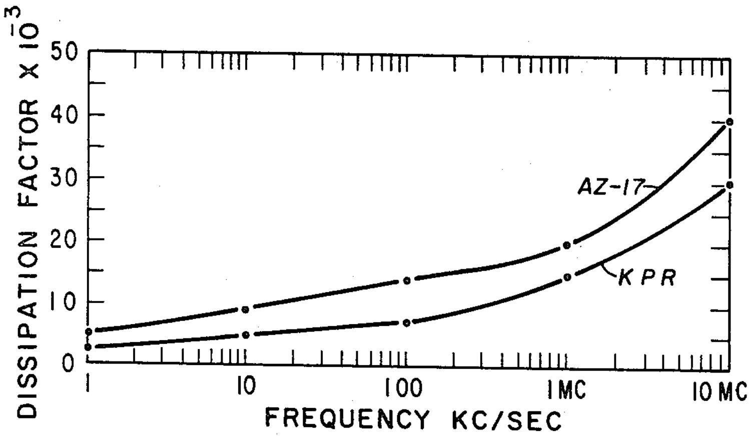
Figure 7:
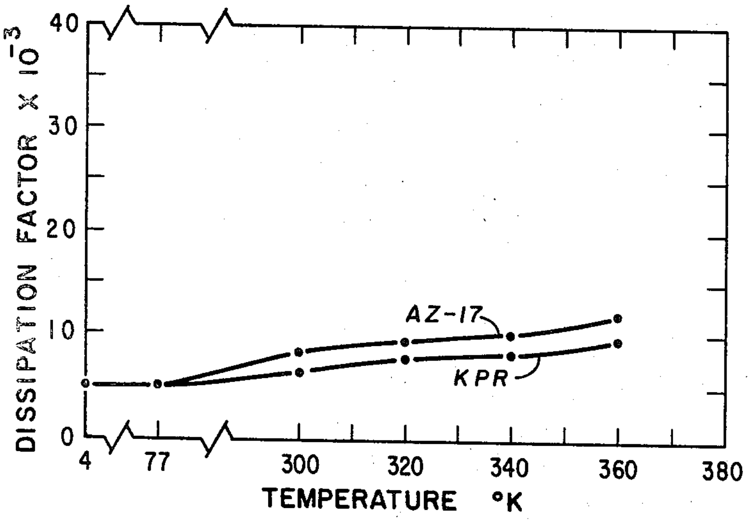
Figure 8:
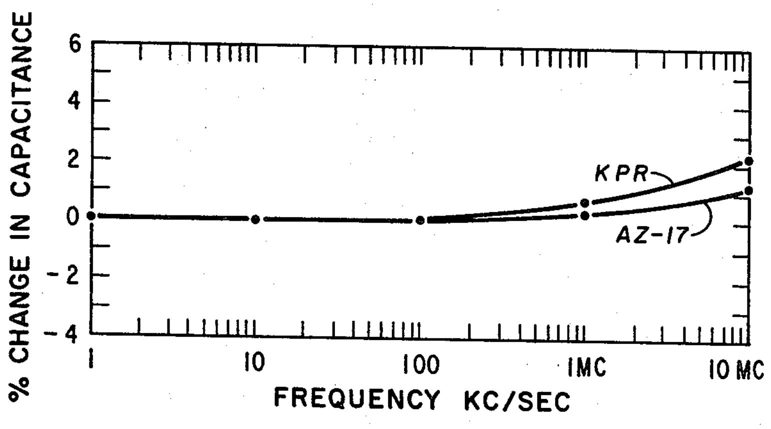
Figure 9:
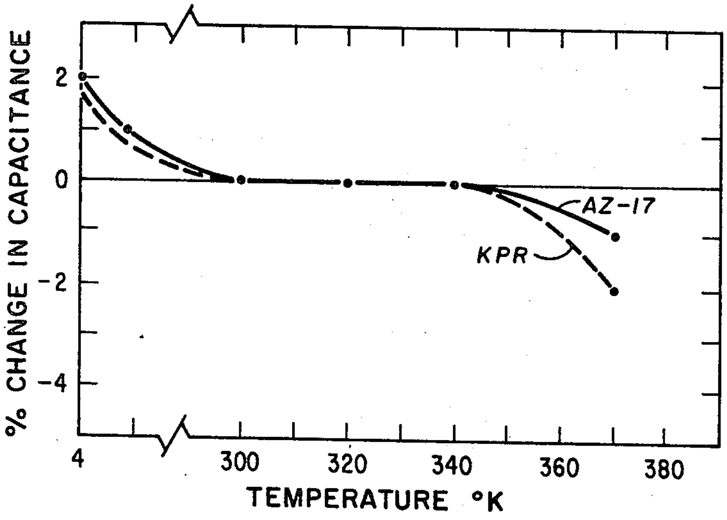

The capacitors were then tested and the electrical properties noted as illustrated by the graphs of FIGURES 4–9. The conductivities of the films with respect to temperature are illustrated in FIGURE 4. The low temperature measurements were obtained by submerging the capacitors in liquid nitrogen and liquid helium, and the higher temperatures were obtained in an oven. The specific points on the curves are average values of the capacitors tested. None of the values measured deviated more than an order of magnitude. The conductivities with respect to voltage of the capacitors are illustrated in FIGURE 5, the dissipation factors with respect to frequency and temperature are illustrated in FIGURES 6 and 7, respectively, and the percent change in capacitance with respect to frequency and temperture are illustrated in FIGURES 8 and 9, respectively.

The thicknesses of the insulating films were measured using an interferometer in the manner described by S. Tolansky, "Multiple-Beam Interferometry," Oxford Press (1948). Predictable values of capacitors were readily determined on the basis of plate area and film thickness calibration charts. This indicates that the properties of the materials and fabrication process are reproducible. The dielectric constants were calculated from capacitance and film thickness measurements to be approximately 1.8 and 4.2 for AZ–17 and KPR, respectively. Capacitors were fabricated with values between 40 and 5,000 microfarads, and with film thicknesses between 5,000 and 15,000 angstroms.

In accordance with another aspect of the invention, the properties of the insulating films prepared by the above process can be improved by doping the photoresist solution with additional material having the desired properties. The polymerized photoresist material then acts as a binder, and the solution can be patterned using the photographic techniques conventional in the art. For example, silicon oils, such as Dow Corning DC–704, may be added to improve the mechanical strength, or the dielectric properties may be improved by adding a fine powder of quartz crystal or of barium titanate. These foreign materials may enter into solution with the photoresist, as in the case of the silicon oils and barium titanate, or may merely be held in suspension as in the case of the quartz crystals. We have obtained evidence that the silicon oil is also driven to a high order polymer by irradiation with the charged particles. The precise percentages of dopant added to the photoresist binder does not appear critical. In general, the more dopant added, the greater the improvement in the insulation, but at the expense of patternability and resoltuion. Thus in its broader aspects, this invention contemplates the use of a patternable photosensitive or light-sensitive polymer as a binder for other materials having superior dielectric properties, particularly when the photosensitive polymer is fixed by irradiation with charged particles as described above.

Although the process has been described in connection with the fabrication of cryotron circuits, it will be appreciated that within the broader aspects of the invention, the electrical contact between the two sequentially deposited metal films may be substantially improved by the cleaning process herein described. Further, the use of the photoresist material for thin film circuit fabrication not only reduces the process steps required to fabricate a particular circuit, but the high order polymer organic films formed from the photoresist appear to be more resistant to thermal shock than films of more conventional insulating films such as the silicon oxides. Further, well defined miniature patterns are more easily obtained by directly patterning the insulating films as described above, and this also simplifies the overall process by elimination of additional steps. The insulating films may be used to advantage in most thin film circuits and in capacitors, provided the upper temperature limits of the organic material are not exceeded during the process steps of fabricating the circuits, or in the subsequent use of the circuits.

Although a preferred embodiment of the invention has been described in detail, it is to be understood that various changes, substitutions and alterations can be made therein without departing from the spirit and scope of the invention as defined by the appended claims.

What is claimed is:

1. In a process for producing thin film circuits from at least two sequentially deposited films, the steps comprising:

placing a first metal film in a vacuum chamber and evacuating the chamber to remove all undesirable gases, backfilling the vacuum chamber with a gas taken from the group consisting of argon, nitrogen, hydrogen and steam to a pressure from about $10^{-3}$ to about $10^{-2}$ millimeters of mercury, applying a voltage to a pair of spaced electrodes in the vacuum chamber so as to ionize particles of the gas, accelerated the ionized particles and bombard the surface of the first metal film, and depositing a second metal film on the first metal film without breaking the vacuum by evaporating the metal and condensing it on the exposed surface of the first metal film and the substrate.

2. A process for producing a cryotron comprising the steps of:

depositing a first metal film on a substrate, selectively removing predetermined portions of the metal film to form a first set of conductors, forming an insulating layer over the first set of conductors and substrate having windows over portions of the first metal film where electrical contact is desired, placing the substrate in a vacuum chamber and evacuating the chamber to remove all undesirable gases, backfilling the vacuum chamber with a gas taken from the group consisting of argon, nitrogen, hydrogen and steam to a pressure from about $10^{-3}$ to about $10^{-2}$ millimeters of mercury, applying a voltage to a pair of spaced electrodes in the vacuum chamber so as to ionize particles of the gas, accelerate the ionized particles and bombard the exposed surface of the first metal film until the surface is cleaned, depositing a second metal film on the exposed surface of the first metal film without breaking the vacuum, and selectively removing predetermined portions of the second metal film to form conductors.

3. A process according to claim 2, wherein the gas is argon.

4. In a process for producing a thin film circuit, the steps of:

depositing a first metal film on a substrate, selectively removing predetermined portions of the metal film to form a first set of conductors, applying a film of a photosensitive polymer over the metal film and substrate and selectively removing predetermined portions of the polymer film by exposure and development to exposed predetermined portions of the first metal film where electrical contact is required, placing the substrate in a vacuum chamber and evacuating the chamber to remove substantially all undesirable gases, backfilling the vacuum chamber with a gas taken from the group consisting of argon, helium, nitrogen, hydrogen and steam to a pressure of from about $10^{-3}$ to about $10^{-2}$ millimeters of mercury, applying a voltage to a pair of spaced electrodes in the vacuum chamber so as to ionize particles of the gas, accelerate the ionized particles, and bombard the exposed surface of the first metal film until the surface is cleaned and irradiate the polymer film until the polymer is polymerized and fixed, depositing a second metal film on the exposed surface of the first metal film without breaking the vacuum, and selectively removing predetermined portions of the second metal film to form conductors.

5. A process according to claim 4, wherein the gas is argon.

6. In a process for fabricating a thin film circuit, the steps of:

forming a patterned metal film on a substrate, applying a film of photosensitive polymer over the substrate, exposing a selected portion of said photosensitive polymer to ultra-violet light, developing said exposed portion of said polymer, removing said exposed portion of said polymer to expose portions of said metal film, placing the substrate in a vacuum chamber and evacuating the chamber to remove substantially all undesirable gases, backfilling the vacuum chamber with a inert gas to a pressure from about $10^{-3}$ to about $10^{-2}$ millimeters of mercury, applying a voltage to a pair of spaced electrodes in the vacuum chamber so as to strike a glow discharge, the dark portion of which envelops the substrate, thereby bombarding the remaining portion of the film of photosensitive polymer and the exposed portion of the metal film with ionized particles to fix the polymer and clean the metal surface, and depositing a second metal film over the fixed polymer and the exposed portion of the metal film.

7. The process according to claim 6, wherein the gas is argon.

8. In a method of fabricating a parallel plate capacitor the steps of:

applying a film of photosensitive polymer to a metal substrate, bombarding the polymer film with ionized particles in a low pressure glow discharge, and depositing a metal film on the polymer film.

9. The process of claim 6 wherein the photosensitive polymer contains silicone oil.

10. The process of claim 6 wherein the photosensitive polymer contains powdered quartz.

11. The process of claim 6 wherein the photosensitive polymer contains barium titanate.

References Cited

UNITED STATES PATENTS

| | | | |
|---|---|---|---|
| 3,252,830 | 5/1966 | Cummin et al. | 117—212 XR |
| 3,288,638 | 11/1966 | Van Paassen et al | 117—93.1 X |
| 3,310,424 | 3/1967 | Wehner et al. | 117—212 |
| 3,352,713 | 11/1967 | Schofer et al. | 117—212 XR |
| 1,818,073 | 8/1931 | Scott | 117—93.31 |
| 2,668,133 | 2/1954 | Brophy et al. | 117—93.31 |
| 2,962,364 | 11/1960 | Cornish | 156—8 |
| 2,974,284 | 3/1961 | Parker | 156—8 |
| 3,113,896 | 12/1963 | Mann | 117—212 |
| 3,119,707 | 1/1964 | Christy | 117—212 |
| 3,133,828 | 5/1964 | Slatkin | 117—93.31 |
| 3,137,674 | 6/1964 | Marans et al. | 117—93.31 |
| 3,298,863 | 1/1967 | McCusker | 117—212 |

OTHER REFERENCES

"Vacuum Deposition of Thin Films" Holland, 1956, John Wiley & Sons, pp. 74 and 75 relied on.

WILLIAM L. JARVIS, *Primary Examiner.*

U.S. DEPARTMENT OF COMMERCE

PATENT OFFICE

Washington, D.C. 20231

UNITED STATES PATENT OFFICE

CERTIFICATE OF CORRECTION

Patent No. 3,402,073 September 17, 1968

Joe T. Pierce et al.

It is certified that error appears in the above identified patent and that said Letters Patent are hereby corrected as shown below:

Column 9, line 18, "accelerated" should read -- accelerate --; line 23, cancel "and the substrate"; line 59, "exposed" should read -- expose --.

Signed and sealed this 3rd day of February 1970.

(SEAL)
Attest:

Edward M. Fletcher, Jr.
Attesting Officer

WILLIAM E. SCHUYLER, JR.
Commissioner of Patents